(12) United States Patent
Peter et al.

(10) Patent No.: US 9,196,789 B2
(45) Date of Patent: Nov. 24, 2015

(54) REFLECTIVE CONTACT LAYER SYSTEM FOR AN OPTOELECTRONIC COMPONENT AND METHOD FOR PRODUCING SAME

(71) Applicants: OSRAM Opto Semiconductors GmbH, Regensburg (DE); Fraunhofer-Gesellschaft zur Förderung der angewandten Forschung e.V., München (DE)

(72) Inventors: Matthias Peter, Regensburg (DE); Simeon Katz, Obertraubling (DE); Jürgen Off, Regensburg (DE); Korbinian Perzlmaier, Regensburg (DE); Kai Gehrke, Regensburg (DE); Rolf Aidam, Wyhl (DE); Jürgen Däubler, Freiburg (DE); Thorsten Passow, Freiburg (DE)

(73) Assignees: OSRAM Opto Semiconductors GmbH, Regensburg (DE); Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 14/418,913

(22) PCT Filed: Jul. 24, 2013

(86) PCT No.: PCT/EP2013/065638
§ 371 (c)(1),
(2) Date: Jan. 30, 2015

(87) PCT Pub. No.: WO2014/019917
PCT Pub. Date: Feb. 6, 2014

(65) Prior Publication Data
US 2015/0270437 A1    Sep. 24, 2015

(30) Foreign Application Priority Data

Jul. 31, 2012 (DE) .......................... 10 2012 106 998

(51) Int. Cl.
*H01L 33/32* (2010.01)
*H01L 33/10* (2010.01)
(Continued)

(52) U.S. Cl.
CPC .......... *H01L 33/10* (2013.01); *H01L 31/02002* (2013.01); *H01L 31/02005* (2013.01);
(Continued)

(58) Field of Classification Search
CPC ... H01L 33/10; H01L 33/0008; H01L 33/405; H01L 33/0075; H01L 33/0062–33/0079; H01L 33/30–33/325; H01L 31/02002; H01L 31/02005; H01L 31/02161; H01L 31/02167; H01L 31/02168; H01L 31/022441; H01L 31/022425; H01L 31/022475; H01L 31/0236; H01L 31/0304–31/03048; H01L 31/184–31/1856; H01L 31/054; H01L 31/056
See application file for complete search history.

(56) References Cited

U.S. PATENT DOCUMENTS 8,907,359 B2    12/2014   Strassburg et al.
2008/0111144 A1    5/2008   Fichtenbaum et al.
(Continued)

FOREIGN PATENT DOCUMENTS

DE    102008052405 A1    4/2010
KR    1020110081650 A    7/2011
WO    2010045907 A1    4/2010

OTHER PUBLICATIONS

Huang, J.B. et al., "Improvement of ESD Level of GaN-Based LEDs Using Antiparallel Ga- and N-Polar Domains in p-GaN Layer," IEEE Electron Device Letters, vol. 32, No. 3, Mar. 2011, 3 pages.

(Continued)

*Primary Examiner* — Tucker Wright
*Assistant Examiner* — Grant Withers
(74) *Attorney, Agent, or Firm* — Slater & Matsil, L.L.P.

(57) ABSTRACT

A reflective contact layer system and a method for forming a reflective contact layer system for an optoelectronic component are disclosed. In an embodiment the component includes a first p-doped nitride compound semiconductor layer, a transparent conductive oxide layer, a minor layer and a second p-doped nitride compound semiconductor layer arranged between the first p-doped nitride compound semiconductor layer and the transparent conductive oxide layer, wherein the second p-doped nitride compound semiconductor layer has N-face domains at an interface facing the transparent conductive oxide layer, and wherein the N-face domains at the interface have an area proportion of at least 95%.

15 Claims, 1 Drawing Sheet

(51) Int. Cl.
*H01L 33/40* (2010.01)
*H01L 33/00* (2010.01)
*H01L 33/42* (2010.01)
*H01L 31/02* (2006.01)
*H01L 33/30* (2010.01)
*H01L 33/36* (2010.01)
*H01L 33/46* (2010.01)
*H01L 31/0216* (2014.01)
*H01L 31/0224* (2006.01)
*H01L 31/0236* (2006.01)
*H01L 31/0304* (2006.01)
*H01L 31/18* (2006.01)
*H01L 31/054* (2014.01)
*H01L 31/056* (2014.01)

(52) U.S. Cl.
CPC ...... *H01L31/0236* (2013.01); *H01L 31/02161* (2013.01); *H01L 31/02167* (2013.01); *H01L 31/02168* (2013.01); *H01L 31/022425* (2013.01); *H01L 31/022441* (2013.01); *H01L 31/022475* (2013.01); *H01L 31/0304* (2013.01); *H01L 31/054* (2014.12); *H01L 31/056* (2014.12); *H01L 31/184* (2013.01); *H01L 33/0008* (2013.01); *H01L 33/0062* (2013.01); *H01L 33/0075* (2013.01); *H01L 33/30* (2013.01); *H01L 33/325* (2013.01); *H01L 33/36* (2013.01); *H01L 33/405* (2013.01); *H01L 33/42* (2013.01); *H01L 33/46* (2013.01); *H01L 2933/0016* (2013.01); *H01L 2933/0025* (2013.01); *H01L 2933/0058* (2013.01)

(56) References Cited

U.S. PATENT DOCUMENTS

| | | |
|---|---|---|
| 2008/0185608 A1 | 8/2008 | Chitnis |
| 2010/0275837 A1 | 11/2010 | Hashimoto et al. |
| 2011/0033966 A1 | 2/2011 | Su et al. |
| 2011/0316028 A1* | 12/2011 | Strassburg et al. ............ 257/98 |

OTHER PUBLICATIONS

Leroux, M. et al., "Structural Defects and Relation with Optoelectronic Properties in Highly Mg-Doped GaN," Phys. Stat. Sol. (a) 192, No. 2, Aug. 2002, 7 pages.

Romano, L.T. et al., "Feceted Inversion Domain Boundary in GaN Films Doped with Mg," Applied Physics Letters, vol. 77, No. 16, Oct. 16, 2000, 3 pages.

Vennegues, P. et al., "Atomic Structure of Pyramidal Defects in Mg-Doped GaN," Physical Review B68, 235214, Dec. 31, 2003, 8 pages.

* cited by examiner

REFLECTIVE CONTACT LAYER SYSTEM FOR AN OPTOELECTRONIC COMPONENT AND METHOD FOR PRODUCING SAME

This patent application is a national phase filing under section 371 of PCT/EP2013/065638, filed Jul. 24, 2013, which claims the priority of German patent application 10 2012 106 998.0, filed Jul. 31, 2012, each of which is incorporated herein by reference in its entirety.

TECHNICAL FIELD

The invention relates to a reflective contact layer system for an optoelectronic component which is suitable in particular for producing a p-type contact of a nitride compound semiconductor LED, and to a method for producing the contact layer system.

BACKGROUND

So-called thin-film light emitting diode chips are known in which the original growth substrate of the semiconductor layer sequence is detached and instead the semiconductor layer sequence is connected to a carrier at an opposite side relative to the original growth substrate. In this case, the radiation exit surface of the light emitting diode chip is arranged at an opposite surface of the semiconductor layer sequence relative to the carrier, that is to say at the side of the original growth substrate. In such a thin-film light emitting diode chip, it is advantageous if that side of the semiconductor layer sequence which faces the carrier is provided with a mirror layer in order that radiation emitted in the direction of the carrier is deflected in the direction of the radiation exit surface and the radiation efficiency is increased as a result.

In a thin-film light emitting diode chip, the mirror layer generally adjoins a p-type semiconductor region of the light emitting diode chip, wherein the mirror layer also serves for making electrical contact with the p-type semiconductor region. For the visible spectral range, silver is typically chosen as material for the minor layer, since silver is distinguished by high reflection in the visible spectral range.

It has been found that at the p-type contact to the silver layer during the operation of the light emitting diode chip a voltage drop of, for example, approximately 170 mV-250 mV occurs, wherein the contact resistance is approximately $5*10^{-3} \Omega$ cm$^2$ to approximately $7*10^{-3} \Omega$ cm$^2$.

During epitaxial growth, nitride compound semiconductors generally form a wurtzite crystal structure, the crystallographic c-axis of which runs parallel to the growth direction. Depending on the growth parameters, domains in the so-called Ga-face orientation, which corresponds to the crystallographic [0001] direction, or domains with the so-called N-face orientation, which corresponds to the crystallographic [000-1] direction, can arise in this case. Such domains can form in polar, but also in semipolar or nonpolar nitride compound semiconductors.

Nitride compound semiconductors generally have piezoelectric properties, that is to say that they have an electrical polarization even without an external electric field. The orientation of this electric field is opposite for the Ga-face orientation and the N-face orientation. For this reason, domains having Ga-face orientation and N-face orientation have different electrical properties.

The document WO 2010/045907 A1, also published as U.S. Pat. No. 8,907,359 B2, describes a contact layer system for an optoelectronic component in which a p-type contact layer composed of a nitride compound semiconductor adjoins a connection layer, wherein the p-type contact layer at an interface with the connection layer has first domains having a Ga-face orientation and second domains having an N-face orientation. Said document specifies that the area proportion of the N-face domains should preferably be between 30 percent and 60 percent in order to obtain a contact resistance that is as low as possible.

SUMMARY OF THE INVENTION

Embodiments of the invention provide an improved contact layer system for forming the p-type contact of an optoelectronic nitride compound semiconductor component which is distinguished both by a low contact resistance and by high reflection for the radiation emitted by the optoelectronic component. Furthermore, an advantageous method for producing the contact layer system is intended to be specified.

In accordance with at least one embodiment, the reflective contact layer system for an optoelectronic component comprises a first p-doped nitride compound semiconductor layer, a transparent conductive oxide layer and a mirror layer. A second p-doped nitride compound semiconductor layer is advantageously arranged between the first p-doped nitride compound semiconductor layer and the transparent conductive oxide layer, said second p-doped nitride compound semiconductor layer having N-face domains at an interface facing the transparent conductive oxide layer, wherein the N-face domains at the interface have an area proportion of at least 95%.

The reflective contact layer system described here makes use of the insight that an electrical contact distinguished both by a high reflectivity and by a low contact resistance can be realized by means of the second p-doped nitride compound semiconductor layer arranged between the first p-doped nitride compound semiconductor layer and the transparent conductive oxide layer and having a very high area proportion of N-face domains.

The low contact resistance is based, in particular, on the fact that the N-face domains have the properties of an n-type semiconductor material. This effect is presumably based on the fact that crystal defects occur in the N-face domains and more than compensate for the acceptors of the nominally p-doped semiconductor material. By virtue of the fact that the N-face domains have n-type properties, a local tunnel junction forms at the interface between the second p-doped nitride compound semiconductor layer and the adjoining layer composed of the transparent conductive oxide. This effect brings about the electrical connection of the transparent conductive oxide layer virtually without a voltage drop.

The minor layer advantageously adjoins the interface of the transparent conductive oxide layer facing away from the second p-doped nitride compound semiconductor layer and brings about a high reflectivity for radiation impinging on the contact layer system from the semiconductor material. In the case of the contact layer system, the contact resistance and the voltage loss are advantageously lower than in the case of the minor layer being directly applied to the p-doped nitride compound semiconductor material. The contact resistance can be, in particular, only $5*10^{-5} \Omega$ cm$^2$ or less.

Furthermore, a high reflectivity is obtained with the contact layer system constructed in this way. The high reflectivity is based, in particular, on the high area proportion of the comparatively smooth N-face domains at the interface. In particular, losses as a result of light scattering at the interface between the second p-doped nitride compound semiconductor layer and the transparent conductive oxide layer are reduced as a result. Light from the semiconductor material can therefore penetrate into the transparent conductive oxide layer without significant scattering losses and is reflected back in the direction of the semiconductor layers at the opposite interface of the mirror layer.

The transparent conductive oxide layer advantageously has a lower refractive index than the second p-doped nitride compound semiconductor layer. Consequently, total internal reflection occurs at the interface between the second p-doped nitride compound semiconductor layer and the transparent conductive oxide layer at least for the proportion of the light coming from semiconductor material which impinges on the interface with an angle of incidence greater than the angle of total internal reflection. The total internal reflection is promoted by a particularly smooth interface on account of the avoidance of scattering losses. Consequently, the interface between the second p-doped nitride compound semiconductor layer and the transparent conductive oxide layer also contributes to the reflectivity of the contact layer system. The total reflectivity of the contact layer system is advantageously increased in this way.

It has been found that in the case of a very high area proportion of N-face domains of at least 95%, the second nitride compound semiconductor layer forms a smoother interface than in the case of a lower area proportion of N-face domains.

In one preferred configuration, the N-face domains of the second p-doped nitride compound semiconductor layer at the interface with the transparent conductive oxide layer have an area proportion of at least 98%.

In one particularly preferred configuration, the second p-doped nitride compound semiconductor layer has N-face domains at the entire interface with the transparent conductive oxide layer. In this case, a particularly smooth interface is obtained and a high reflection is thus obtained.

The rms (root mean square) roughness of the interface between the second p-doped nitride compound semiconductor layer and the transparent conductive oxide layer is advantageously less than 7 nm. The rms roughness is preferably less than 5 nm and particularly preferably less than 3 nm.

The area proportion of the N-face domains at the interface between the second p-doped nitride compound semiconductor layer and the transparent conductive oxide layer can be set, in particular, by the level of the dopant concentration and the growth conditions of the second p-doped nitride compound semiconductor layer. The formation of N-face domains is promoted by a high dopant concentration. The dopant concentration in the second p-doped nitride compound semiconductor layer is advantageously more than $2*10^{20}$ cm$^{-3}$, preferably more than $3*10^{20}$ cm$^{-3}$ and particularly preferably more than $5*10^{20}$ cm$^{-3}$.

Furthermore, the layer thickness of the second p-doped nitride compound semiconductor layer has an influence on the domain structure at the interface. In order to obtain a high area proportion of N-face domains, the second p-doped nitride compound semiconductor layer advantageously has a thickness of at least 10 nm, preferably of at least 20 nm and particularly preferably of at least 40 nm. By way of example, the second p-doped nitride compound semiconductor layer can have a thickness of between 10 and 50 nm inclusive.

It has been found that the second p-doped nitride compound semiconductor layer can be produced with a high proportion of very smooth N-face domains in particular by epitaxial growth onto the first p-doped nitride compound semiconductor layer by means of molecular beam epitaxy. In particular, it has been established that, as a result of the growth of the second p-doped nitride compound semiconductor layer, it is possible to obtain an even lower contact resistance than in the case of the growth of the second p-doped nitride compound semiconductor layer by means of metal organic vapor phase epitaxy (MOVPE).

The second p-doped nitride compound semiconductor layer preferably comprises GaN. Advantageously, the first p-doped nitride compound semiconductor layer also comprises GaN. In particular, both the first and the second p-doped nitride compound semiconductor layers can be GaN layers. Magnesium is preferably used as p-type dopant for the first and/or the second nitride compound semiconductor layer.

The second p-doped nitride compound semiconductor layer advantageously adjoins the transparent conductive oxide layer. Transparent conductive oxides ("TCOs" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds, such as, for example, ZnO, SnO$_2$ or In$_2$O$_3$, ternary metal-oxygen compounds, such as, for example, Zn$_2$SnO$_4$, CdSnO$_3$, ZnSnO$_3$, MgIn$_2$O$_4$, GaInO$_3$, Zn$_2$In$_2$O$_5$ or In$_4$Sn$_3$O$_{12}$, or mixtures of different transparent conductive oxides also belong to the group of TCOs.

In accordance with one advantageous configuration, the transparent conductive oxide layer comprises indium tin oxide (ITO) or zinc oxide (ZnO). These transparent conductive oxides are distinguished by a high transparency and a high electrical conductivity. The transparent conductive oxide layer can contain a dopant; by way of example, it can be a zinc oxide layer doped with aluminum.

The minor layer advantageously adjoins the transparent conductive oxide layer at an opposite interface relative to the second p-doped nitride compound semiconductor layer. The minor layer preferably contains a metal or a metal alloy. In order to obtain a high reflection in the visible spectral range, the minor layer preferably contains silver or consists thereof.

In the method for producing a reflective contact layer system, at least the second p-doped nitride compound semiconductor layer is produced by means of molecular beam epitaxy. It has been found that, in particular, the production by means of molecular beam epitaxy enables the formation of N-face domains having very smooth interfaces. In particular, it has been established that a particularly low contact resistance can be obtained with a second p-doped nitride compound semiconductor layer produced by molecular beam epitaxy.

Furthermore, an optoelectronic component comprising the reflective contact layer system is specified, wherein the optoelectronic component comprises an epitaxial layer sequence, containing an n-type semiconductor region, an active layer and a p-type semiconductor region. The p-type semiconductor region of the optoelectronic component contains the first p-doped nitride compound semiconductor layer and the second p-doped nitride compound semiconductor layer. In the case of the optoelectronic component, the n-type semiconductor region faces a radiation exit surface and the p-type semiconductor region faces a carrier.

BRIEF DESCRIPTION OF THE DRAWINGS

Further advantageous configurations of the method and of the optoelectronic component are evident from the description of the reflective contact layer system, and vice versa.

The invention is explained in greater detail below on the basis of exemplary embodiments in association with FIGS. 1 and 2.

In the figures:

FIG. 1 shows a schematic illustration of a cross section through a reflective contact layer system in accordance with one exemplary embodiment, and FIG. 2 shows an optoelectronic component comprising a reflective contact layer system in accordance with one exemplary embodiment.

Identical or identically acting constituent parts are provided with the same reference signs in each case in the figures. The illustrated constituent parts and also the size relationships of the constituent parts among one another should not be regarded as true to scale.

DETAILED DESCRIPTION OF ILLUSTRATIVE EMBODIMENTS

Figure 1:
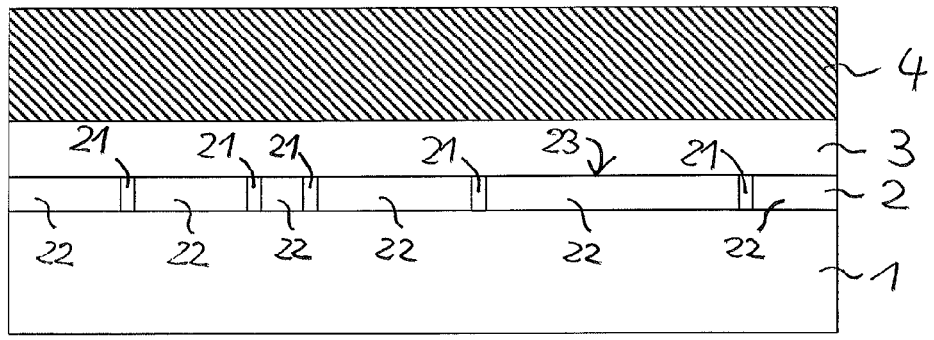

The exemplary embodiment of a reflective contact layer system for an optoelectronic component as illustrated in FIG. 1 comprises a first p-doped nitride compound semiconductor layer 1 and a second p-doped nitride compound semiconductor layer 2, which adjoins the first p-doped nitride compound semiconductor layer 1. The p-doped nitride compound semiconductor layers 1, 2 in each case comprise, for example, a nitride compound semiconductor material having the composition $In_xAl_yGa_{1-x-y}N$, wherein $0 \leq x \leq 1$, $0 \leq y \leq 1$ and $x+y \leq 1$. The first p-doped nitride compound semiconductor layer 1 and the second p-doped nitride compound semiconductor layer 2 are preferably GaN layers in each case. The p-doped nitride compound semiconductor layers 1, 2 can comprise magnesium, in particular, as p-type dopant.

Furthermore, the reflective contact layer system contains a transparent conductive oxide layer 3, adjoining the second p-doped nitride compound semiconductor layer 2. The transparent conductive oxide layer 3 preferably contains indium tin oxide or zinc oxide. Alternatively, however, other transparent conductive oxides are also suitable.

A mirror layer 4 is arranged at a side of the transparent conductive oxide layer 3 facing away from the p-doped nitride compound semiconductor layers 1, 2. The minor layer 4 is preferably a layer composed of a metal or a metal alloy. The mirror layer 4 preferably contains silver or consists thereof.

The second p-doped nitride compound semiconductor layer 2 advantageously contains N-face domains 22. Alongside the N-face domains 22, the second p-doped nitride compound semiconductor layer 2 can also have Ga-face domains 21 at least in a small proportion.

At the interface 23 with the transparent conductive oxide layer 3, the area proportion of the N-face domains 22 in the second p-doped nitride compound semiconductor layer 2 is advantageously at least 95%, preferably at least 98% and particularly preferably at least 99%. In particular, the second p-doped nitride compound semiconductor layer 2 can have N-face domains 22 at the entire interface 23 with the transparent conductive oxide layer 3.

The high area proportion of the N-face domains 22 at the interface 23 of the second p-doped nitride compound semiconductor layer 2 has the advantage that an electrical contact with the transparent conductive oxide layer 3 with low contact resistance is formed, without the reflectivity of the contact layer sequence being impaired. A reduction of the reflectivity could occur particularly in the case of a lower area proportion of the N-face domains 22, since an increased roughness of the interface 23 can occur in the case of a higher area proportion of Ga-face domains 21, for example, in the case of approximately equal area proportions of Ga-face domains 21 and N-face domains 22. Although the document WO 2010/045907 A1, cited in the introduction, discloses that a particularly light contact resistance can be obtained in particular also with approximately equal proportions of N-face domains and Ga-face domains, this can lead to a reduced reflectivity on account of an increased interface roughness in the case of a reflective contact layer system. It has advantageously been found that with a high area proportion of the N-face domains 22 of at least 95% it is possible to realize a contact layer system which is distinguished by both a low contact resistance and a high reflectivity.

The second p-doped nitride compound semiconductor layer 2 has a very smooth interface 23 with the subsequent transparent conductive oxide layer 3 on account of the high area proportion of the N-face domains 22. Advantageously, the rms roughness of the interface 23 between the second p-doped nitride compound semiconductor layer 2 and the transparent conductive oxide layer 3 is less than 7 nm, preferably less than 5 nm and particularly preferably less than 3 nm.

The preferred formation of N-face domains 22 in the second p-doped nitride compound semiconductor layer 2 is promoted by a high dopant concentration. Advantageously, the dopant concentration in the second p-doped nitride compound semiconductor layer 2 is at least $2*10^{20}$ cm$^{-3}$, preferably at least $3*10^{20}$ cm$^{-3}$ and particularly preferably at least $5*10^{20}$ cm$^{-3}$.

The area proportion of the N-face domains 22 at the interface 23 is also influenced by the layer thickness of the second p-doped nitride compound semiconductor layer 2. Advantageously, the layer thickness of the second p-doped nitride compound semiconductor layer 2 is at least 10 nm, preferably at least 20 nm and particularly preferably at least 40 nm. The layer thickness of the second p-doped nitride compound semiconductor layer 2 is between 10 nm and 50 nm, for example.

Furthermore, the process conditions, in particular the coating method used for growing the second p-doped nitride compound semiconductor layer 2, influence the proportion of the N-face domains 22 in the second p-doped nitride compound semiconductor layer 2. In one advantageous method for producing the reflective contact layer system, at least the second p-doped nitride compound semiconductor layer 2 is produced by means of molecular beam epitaxy.

Figure 2:
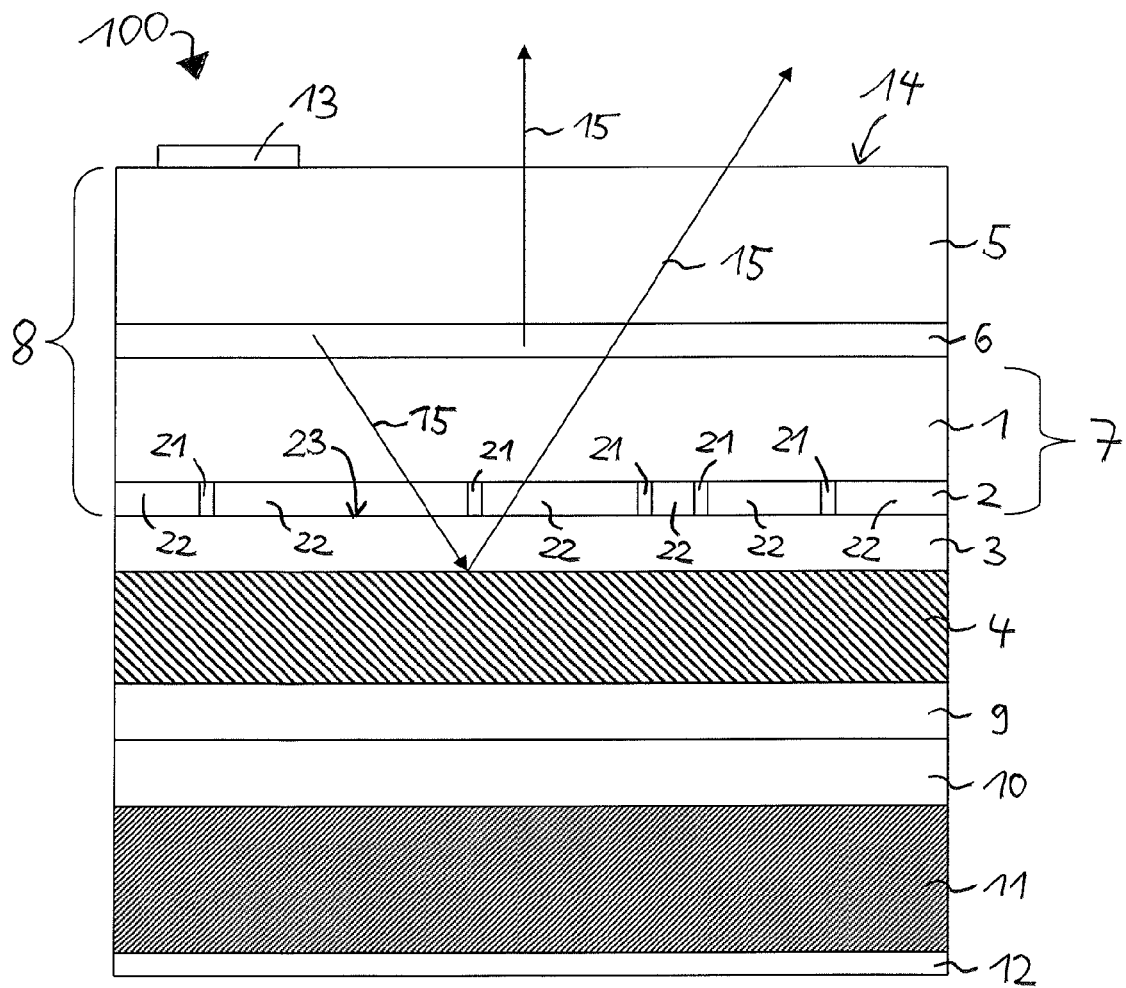

FIG. 2 schematically illustrates in cross section by way of example an optoelectronic component 100 containing a reflective contact layer sequence in accordance with one exemplary embodiment.

The optoelectronic component 100 contains an epitaxial layer sequence 8 based on a nitride compound semiconductor. In the present connection, "based on a nitride compound semiconductor" means that the epitaxial layer sequence 8 or at least one layer thereof comprises a III nitride compound semiconductor material, preferably $In_xAl_yGa_{1-x-y}N$, wherein $0 \leq x \leq 1$, $0 \leq y \leq 1$ and $x+y \leq 1$. In this case, this material need not necessarily have a mathematically exact composition according to the above formula. Rather, it can comprise one or a plurality of dopants and additional constituents which substantially do not change the characteristic physical properties of the $In_xAl_yGa_{1-x-y}N$ material. For the sake of simplicity, however, the above formula only includes the essential constituents of the crystal lattice (In, Al, Ga, N), even if these can be replaced in part by small amounts of further substances.

The epitaxial layer sequence 8 contains an n-type semiconductor region 5, an active layer 6 and a p-type semiconductor region 7. The n-type semiconductor region 5, the active layer 6 and the p-type semiconductor region 7 can in each case comprise a plurality of layers, which are not illustrated in specific detail for the sake of simplification. It is also possible for the n-type semiconductor region 5, the active layer 6 or the p-type semiconductor region 7 to contain one or a plurality of undoped layers. The p-type semiconductor region 7 contains, in particular, the first p-doped semiconductor layer 1 and the second p-doped semiconductor layer 2 of the contact layer system.

The active layer 6 can be, in particular, a radiation-emitting or a radiation-receiving active layer. The active layer 6 can be embodied, for example, as a pn junction, as a double heterostructure, as a single quantum well structure or a multiple quantum well structure. In this case, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The active layer 6 can contain, in particular, one or a plurality of layers composed of InGaN.

The optoelectronic component 100 is a so-called thin-film light emitting diode chip, in which a growth substrate used for the growth of the epitaxial layer sequence 8 was detached from the epitaxial layer sequence 8. The epitaxial layer sequence 8 has been connected to a carrier 11 at an opposite side relative to the original growth substrate. The optoelectronic component 100 therefore contains no growth substrate of the epitaxial layer sequence 8 such as, for example, a sapphire substrate. The epitaxial layer sequence 8 is connected to the carrier 11 at the rear side of the optoelectronic component 100 by means of a connection layer 10, for example, a solder layer. The carrier 11 can comprise, for example, silicon, germanium, a ceramic, a metal or a metal alloy.

In the case of the optoelectronic component 100, the n-type semiconductor region 5 faces the radiation exit surface 14 and the p-type semiconductor region 7 faces the carrier 11.

Electrical contact is made with the p-type semiconductor region 7 from the rear side of the optoelectronic component 100, said rear side facing the carrier 11, with the reflective contact layer system. The reflective contact layer system contains a first p-doped nitride compound semiconductor layer 1, a second p-doped nitride compound semiconductor layer 2, a transparent conductive oxide layer 3 and a minor layer 4. The advantageous configurations of the reflective contact layer system 1, 2, 3, 4 and the advantages resulting therefrom correspond to the exemplary embodiment described in connection with FIG. 1 and, therefore, will not be explained again.

By means of the mirror layer 4 provided in the reflective contact layer system, radiation 15 emitted by the active layer 6 in the direction of the carrier 11 is advantageously reflected in the direction of the radiation exit surface 14. In this way, absorption of the radiation emitted toward the rear side of the optoelectronic component 100 in the carrier 11 is prevented and the efficiency of the optoelectronic component 100 is increased in this way.

Arranged between the minor layer 4 and the solder layer 10 there is preferably one or a plurality of functional layers 9, for example, a layer sequence 9 which comprises, proceeding from the mirror layer 4, partial layers composed of titanium, platinum and gold. In this case, the partial layer composed of platinum advantageously functions as a diffusion barrier that prevents the diffusion of constituents of subsequent layers into the minor layer 4 and vice versa. The partial layer composed of gold functions as a current spreading layer on account of the high electrical conductivity and the subsequent titanium layer functions as an adhesion promoter layer for further subsequent layers.

In order to produce the external electrical connections, provision is made of, for example, a first contact metallization 12 at the rear side of the carrier 11 and a second contact metallization 13 on a partial region of the radiation exit surface 14.

The reflective contact layer system formed by the first p-doped nitride compound semiconductor layer 1, the second p-doped nitride compound semiconductor layer 2, the transparent conductive oxide layer 3 and the minor layer 4 is distinguished by a high reflectivity for the radiation 15 emitted by the active zone 6, and also by a very low contact resistance. The contact resistance can be, in particular, $5*10^{-5} \Omega \text{ cm}^2$ or less.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A reflective contact layer system for an optoelectronic component comprising:
   a first p-doped nitride compound semiconductor layer;
   a transparent conductive oxide layer;
   a mirror layer; and
   a second p-doped nitride compound semiconductor layer arranged between the first p-doped nitride compound semiconductor layer and the transparent conductive oxide layer,
   wherein the second p-doped nitride compound semiconductor layer has N-face domains at an interface facing the transparent conductive oxide layer, and wherein the N-face domains at the interface have an area proportion of at least 95%.

2. The reflective contact layer system according to claim 1, wherein the N-face domains at the interface have an area proportion of at least 98%.

3. The reflective contact layer system according to claim 1, wherein the second p-doped nitride compound semiconductor layer has N-face domains at the entire interface.

4. The reflective contact layer system according to claim 1, wherein the interface has an rms roughness of less than 7 nm.

5. The reflective contact layer system according to claim 1, wherein the interface has an rms roughness of less than 3 nm.

6. The reflective contact layer system according to claim 1, wherein the second p-doped nitride compound semiconductor layer has a dopant concentration of more than $2*10^{20}$ cm$^{-3}$.

7. The reflective contact layer system according to claim 1, wherein the second p-doped nitride compound semiconductor layer has a dopant concentration of more than $5*10^{20}$ cm$^{-3}$.

8. The reflective contact layer system according to claim 1, wherein the second p-doped nitride compound semiconductor layer has a thickness of at least 10 nm.

9. The reflective contact layer system according to claim 1, wherein the second p-doped nitride compound semiconductor layer is grown onto the first p-doped nitride compound semiconductor layer epitaxially by molecular beam epitaxy.

10. The reflective contact layer system according to claim 1, wherein the first p-doped nitride compound semiconductor layer comprises GaN.

11. The reflective contact layer system according to claim 1, wherein the second p-doped nitride compound semiconductor layer comprises GaN.

12. The reflective contact layer system according to claim 1, wherein the transparent conductive oxide layer comprises indium tin oxide or zinc oxide.

13. The reflective contact layer system according to claim 1, wherein the minor layer contains silver.

14. A method for producing a reflective contact layer system according to claim 1, wherein at least the second p-doped nitride compound semiconductor layer is produced by molecular beam epitaxy.

15. An optoelectronic component comprising a reflective contact layer system according to claim 1,
wherein the optoelectronic component comprises an epitaxial layer sequence containing an n-type semiconductor region, an active layer and a p-type semiconductor region,
wherein the p-type semiconductor region contains the first p-doped nitride compound semiconductor layer and the second p-doped nitride compound semiconductor layer,
wherein the n-type semiconductor region faces a radiation exit surface, and
wherein the p-type semiconductor region faces a carrier.

* * * * *